United States Patent [19]

Yamada

[11] Patent Number: 5,801,407
[45] Date of Patent: Sep. 1, 1998

[54] SEMICONDUCTOR INTEGRATED CIRCUIT USING STANDARDIZED ANALOG CELLS

[75] Inventor: Hideyuki Yamada, Hamamatsu, Japan

[73] Assignee: Yamaha Corporation, Hamamatsu, Japan

[21] Appl. No.: 622,084

[22] Filed: Mar. 26, 1996

[30] Foreign Application Priority Data

Mar. 27, 1995 [JP] Japan .................................. 7-093081

[51] Int. Cl.$^6$ .................................. H07L 27/10
[52] U.S. Cl. .......................... 257/207; 257/208; 257/210; 257/409
[58] Field of Search .................... 257/207, 210, 257/211, 204, 206, 409

[56] References Cited

U.S. PATENT DOCUMENTS 5,160,995 11/1992 Wada et al. ............................. 257/207
5,281,835 1/1994 Tomia et al. ............................ 257/204

OTHER PUBLICATIONS

Uyemura, John P., "Fundamentals of MOS Digital Integrated Circuits", Addison–Wesley Publishing Co., Jul. 1998, p. 305.

*Primary Examiner*—Sara W. Crane
*Assistant Examiner*—David B. Hardy
*Attorney, Agent, or Firm*—Pillsbury Madison & Sutro

[57] ABSTRACT

An analog-circuit block, which is fabricated on a chip of a semiconductor integrated circuit, is configured by a plurality of analog cells each having a desired function such as the function of an operational amplifier. The analog cells are standardized with respect to the height thereof. Two power-source wires are provided respectively in an upper-end section and a lower-end section of the analog-circuit block, so that they are commonly used by the analog cells. In the analog cell, input/output wires are placed in a direction perpendicular to the power-source wires. For example, two input wires are provided to input signals for two inputs of an operational amplifier while one output wire is provided to provide an output signal, wherein one of the two input wires is partially connected to the output wire. Further, it is possible to provide a dummy wire which is placed in parallel with the output wire, wherein a midpoint of the output wire is connected to a midpoint of the dummy wire. Because of the provision of the dummy wire, it is possible to suppress interference between circuits. Moreover, the analog cell is surrounded by a guard-ring diffusion layer; and there are provided guard-ring wires to contact with the guard-ring diffusion layer, so that propagation of noise is avoided.

15 Claims, 8 Drawing Sheets

SEMICONDUCTOR INTEGRATED CIRCUIT USING STANDARDIZED ANALOG CELLS

BACKGROUND OF THE INVENTION

1. Field of the invention

The invention relates to semiconductor integrated circuits, having analog circuit blocks, in which chip layout is performed by automatic layout wiring.

2. Prior Art

As for designing methods of LSI circuits (where 'LSI' is an abbreviation for 'Large Scale Integration'), conventional technology employs 'automatic layout wiring' using a CAD system (where 'CAD' is an abbreviation for 'Computer-Aided Design'). When performing the automatic layout wiring, standard cells are registered in a cell library in advance. In the standard cells, plenty of basic logic circuits (i.e., digital circuit blocks) are standardized with respect to height, position of power-source wires and position of input/output wires. Then, the standard cells are subjected to automatic layout wiring on chips based on a logic circuit design and in accordance with predetermined rules.

In the case of analog/digital-mixed LSI circuits, which contain both analog circuits and digital circuits, or in the case of analog LSI circuits, no 'standardized' cells are provided for analog circuit blocks. Therefore, each cell differs with respect to size, position of input terminals and position of power-source wires. So, it is impossible to perform chip layout for those LSI circuits by the automatic layout wiring using the CAD system; in other words, those LSI circuits should be subjected to manual designing which is troublesome and which requires relatively much time. This may cause some restriction in arrangement of cells or in wiring between cells. In short, the LSI circuits suffer from problems due to low design efficiency as well as low area efficiency.

SUMMARY OF THE INVENTION

It is an object of the invention to provide a semiconductor integrated circuit which is capable of improving design efficiency and area efficiency by using cells standardized with respect to analog-circuit blocks.

According to the invention, an analog-circuit block, which is fabricated on a chip of a semiconductor integrated circuit, is configured by a plurality of analog cells each having a desired function. The analog cells are standardized with respect to selected elements such as the height thereof. Two power-source wires are provided respectively in an upper-end section and a lower-end section of the analog-circuit block, so that they are commonly used by the analog cells. In the analog cell, input/output wires are placed in a direction perpendicular to the power-source wires. Further, the analog cell is surrounded by a guard-ring diffusion layer; and there are provided guard-ring wires to contact with the guard-ring diffusion layer. Thus, it is possible to avoid propagation of noise which occurs between the analog cell and its external circuit.

If the analog cell is designed as an operational-amplifier cell having the function of an operational amplifier, the analog cell is configured to use two input wires and one output wire. Herein, the two input wires input signals for two inputs of the operational amplifier and the output wire provides an output signal, wherein one of the two input wires is partially connected to the output wire. Further, it is possible to provide a dummy wire which is placed in parallel with the output wire, wherein a midpoint of the output wire is connected to a midpoint of the dummy wire. Thanks to provision of the dummy wire, it is possible to suppress an interference between circuits.

Since the invention uses 'standardized' analog cells for designing of an analog-circuit block, it is possible to perform automatic layout wiring using a CAD system with ease. Thus, any kind of LSI circuit can be designed with a high design efficiency and a high area efficiency.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Figure 1:
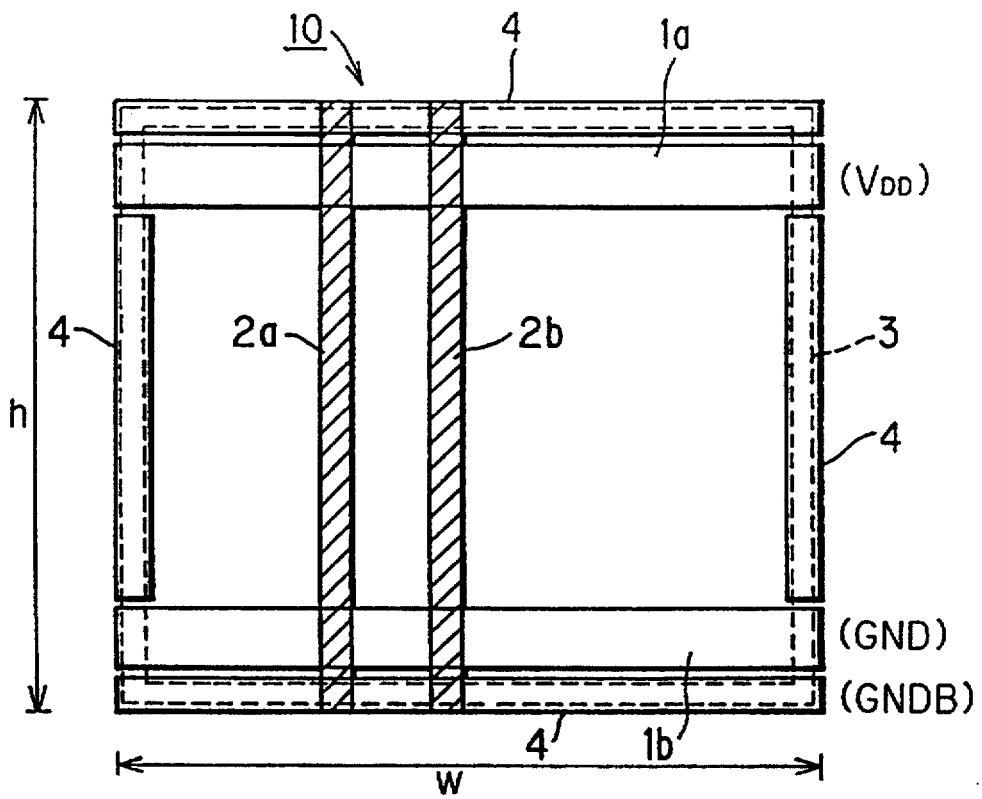
FIG. 1 is a plan view illustrating an analog cell which is designed in accordance with an embodiment of the invention.

FIG. 1 is a plan view illustrating an analog cell 10 which is designed in accordance with an embodiment of the invention. This analog cell 10 is standardized with respect to the height thereof as well as power-source wires, input/output wires and guard rings. The overall size of the analog cell is defined by two elements, i.e., the height of the cell 'h' and the width of the cell 'w'. Among those elements, the embodiment fixes only the height of the cell h with respect to all of the analog cells. In the analog cell of FIG. 1, there are provided two power-source wires 1a and 1b which are arranged in a lateral direction. Specifically, the power-source wire 1a, which is placed in an upper-end section, corresponds to a 'VDD' line; and the power-source wire 1b, which is placed in a lower-end section, corresponds to a 'GND line' (i.e., ground line). Both the power-source wires 1a and 1b form a first layer of metal wiring for the analog cell 10.

Input/output wires 2a and 2b are arranged in a vertical direction, perpendicular to the lateral direction in which the power-source wires 1a and 1b are arranged in the analog cell 10. Input/output terminals are provided at the upper-end section and lower-end section. The upper-end section and lower-end section of the cell 10 contact with a wiring area by which wiring between cells are performed. The input/output wires 2a and 2b form a second layer of metal wiring.

As an example if the analog cell 10 is configured as an operational-amplifier cell using MOS transistors, e.g., four transistors each having width of 50 μm, the width for each of the power-source wires 1a and 1b can be set at 20 μm, while the height of the cell h can be set at approximately 250 μm.

The analog cell 10 is surrounded by a guard-ring diffusion layer 3 which is shown by dotted lines in FIG. 1. The guard-ring diffusion layer 3 is provided to prevent external noise from being propagated to elements within the analog cell 10; and it is provided to avoid noise propagation to external circuits as well. In addition, guard-ring wires 4 are arranged to contact with the guard-ring diffusion layer 3. The guard-ring wires 4 are arranged at certain intervals of distance around the analog cell 10. Like the power-source wires 1a and 1b, the guard-ring wires 4 belong to the first layer of metal wiring in the present embodiment. In addition, the guard-ring wire 4 corresponds to a GNDB line which is grounded like the GND line. Thus, the present embodiment cuts out some sections of the guard-ring wire 4 as a whole which cross the power-source wires 1a and 1b.

Figure 2:
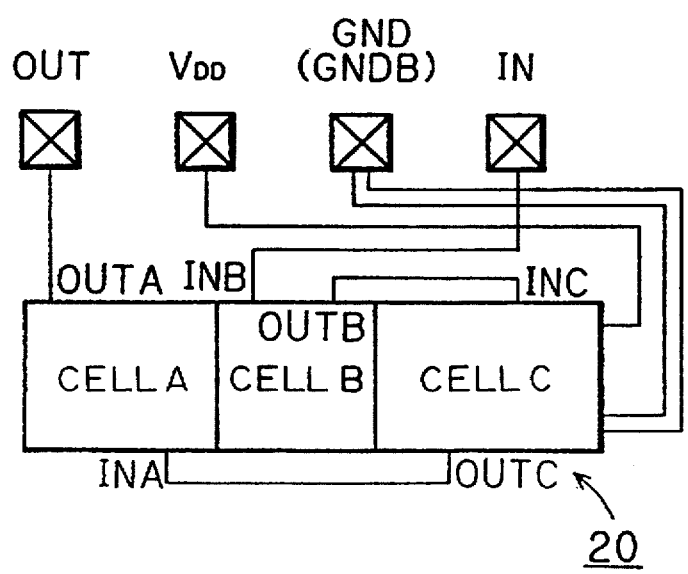
FIG. 2 shows a simple layout for an analog-circuit block which is configured by automatic layout wiring using analog cells.
Figure 3:
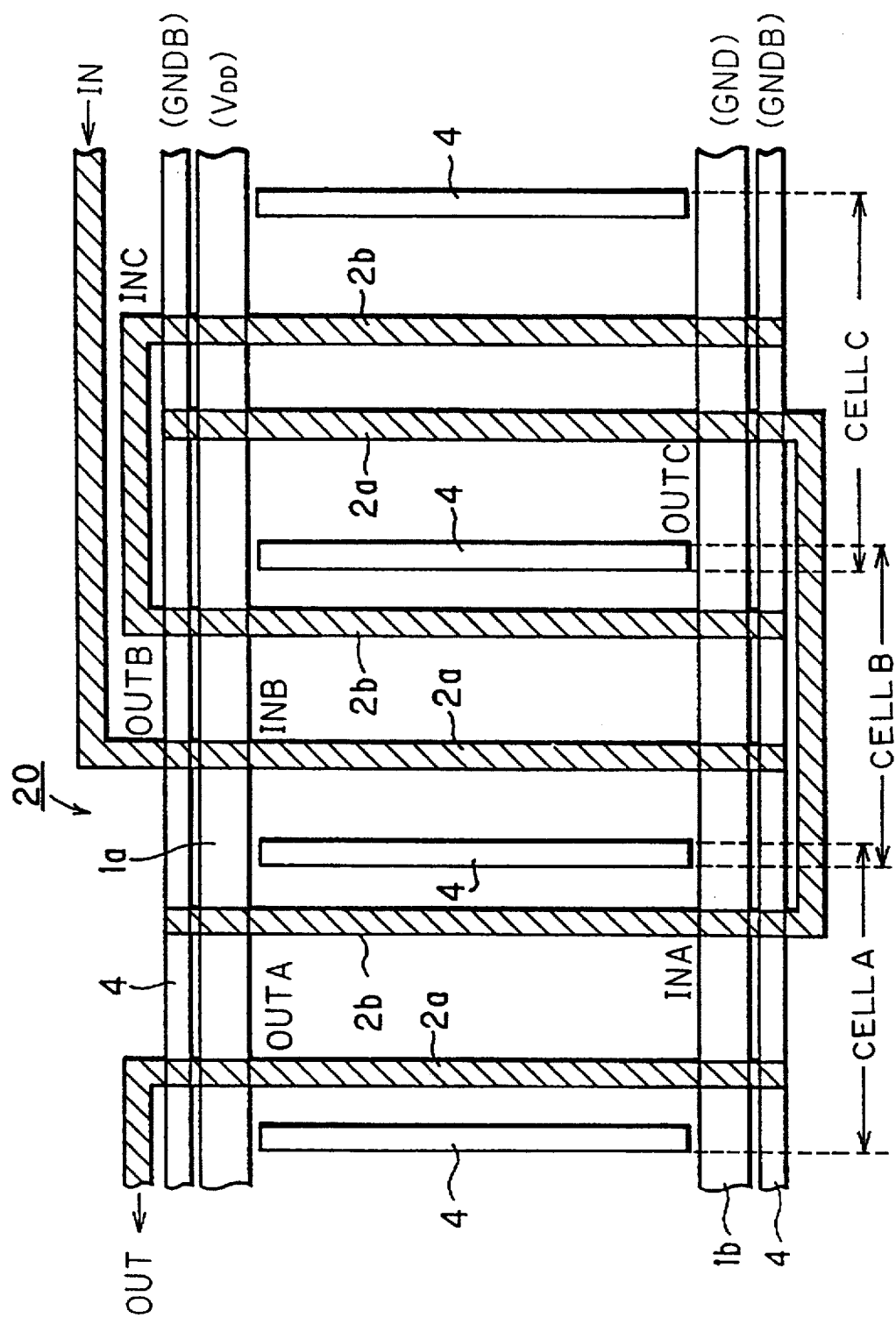
FIG. 3 shows a detailed layout for the analog-circuit block.

FIG. 2 shows an example of a layout of an analog-circuit block 20 which is designed using the 'standardized' analog cell 10 and in accordance with automatic layout wiring using a CAD system. FIG. 2 provides a simple illustration for the layout of the analog-circuit block 20 while FIG. 3 provides an example of concrete illustration for the layout of the analog-circuit block 20. In FIG. 3, three analog cells A, B and C, each having the same height, are arranged in a lateral direction so as to configure the analog-circuit block 20. Herein, the power-source wires 1a and 1b are used in common by all of the analog cells. Similarly, selected parts of the guard-ring diffusion layer 3 and selected parts of the guard-ring wire 4, which are placed in the upper-end section and lower-end section, are used in common by all of the analog cells. In addition, the analog cells are closely arranged with each other wherein some parts thereof are overlapped and shared in the lateral direction. As for two analog cells which are arranged adjacent to each other, the guard-ring diffusion layers 3 and the guard-ring wires 4 are overlapped with each other in the lateral direction. Such common usage for selected parts of the analog cells or such covalent process can be easily carried out by adequately setting conditions for the automatic layout wiring using the CAD system.

Wiring between the analog cells can be carried out by automatic wiring using the CAD system as well. Herein, the automatic wiring is performed partially using the wiring area in the upper-end section and lower-end section. An input terminal 'IN' for the analog-circuit block 20 as a whole coincides with an input terminal 'INB' which is an input terminal of the analog cell B. An output terminal 'OUTB' of the analog cell B is connected to an input terminal 'INC' of the analog cell C. An output terminal 'OUTC' of the analog cell C is connected to an input terminal 'INA' of the analog cell A. Further, an output terminal 'OUTA' of the analog cell A works as an output terminal 'OUT' for the analog-circuit block 20 as a whole.

Figure 4A:
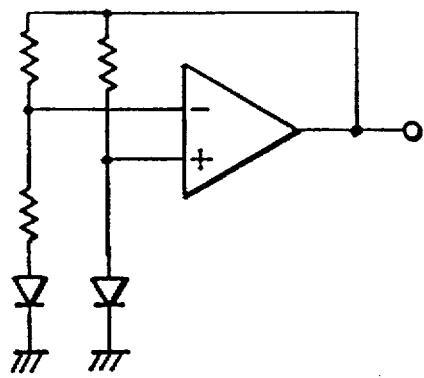
FIGS. 4A to 4C are circuit blocks showing examples of analog circuits to which the invention can be applied.
Figure 4B:
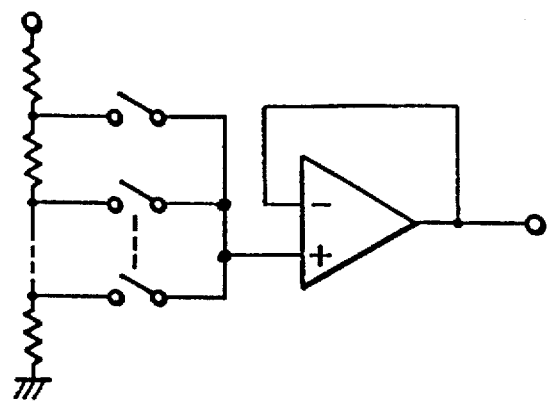
Figure 4C:
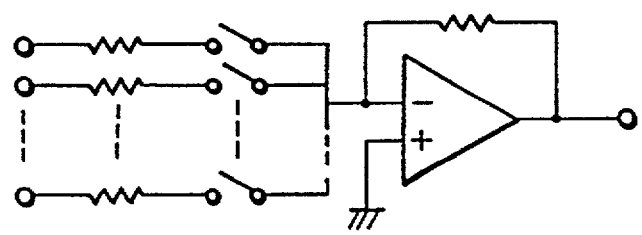

The invention can be applied to a variety of analog circuits such as the band-gap reference circuit of FIG. 4A, the volume circuit of FIG. 4B and the selector circuit of FIG. 4C. Those analog circuits can be realized by the automatic layout wiring using analog cells which are standardized, as shown by FIG. 1, with respect to operational amplifiers, resistor elements, diodes and transfer gates, for example.

Figure 5A:
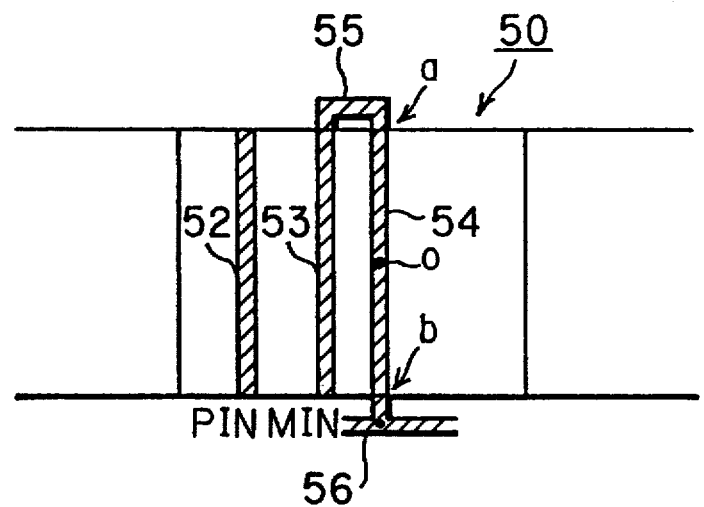
FIG. 5A shows a layout for an operational-amplifier cell.
Figure 5B:
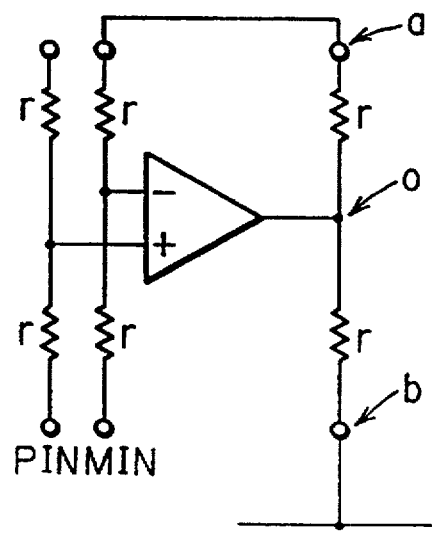
FIG. 5B shows an equivalent circuit of the operational-amplifier cell of FIG. 5A.

If the analog cell of FIG. 1 works as an operational-amplifier cell which is designed in accordance with a layout method, there is a possibility that the layout method may cause a problem. Next, such a problem will be explained with reference to FIGS. 5A and 5B. Herein, FIG. 5A shows an example of a layout of an operational-amplifier cell 50 which is subjected to layout wiring as a buffer, for example. FIG. 5B shows an equivalent circuit of the operational-amplifier cell 50.

In FIG. 5A, two input wires 52 and 53 are laid in a vertical direction of the operational-amplifier cell 50, wherein they are provided for two inputs 'PIN' and 'MIN'. In addition, one output wire 54 is laid in the vertical direction. The input wire 53 is connected to the output wire 54 by a wire 55 at an upper-wiring area. Further, the output wire 54 is connected to a wire 56 at a lower-wiring area. The wire 56 is connected to two cells which are placed right and left of the cell 50.

If each of the input wires 52 and 53 has resistance of '2r' and the output wire 54 has the same resistance of '2r', resistors, each having resistance of 'r', are arranged as shown by the equivalent circuit of FIG. 5B. FIG. 5B shows that a midpoint 'o'(which coincides with an output terminal of the operational amplifier) is connected to a terminal 'b' through a simple resistor having resistance 'r', wherein the output wire 54 is connected to the wire 56 by the terminal 'b'. Actually, there should be provided wiring resistance, between the output wire 54 and the wire 56, in addition to the resistance r. However, such wiring resistance is neglected in order to simplify the configuration of the equivalent circuit. The resistance r, provided between the midpoint o and the terminal b, works as a common impedance for right-side and left-side circuits (not shown) which are connected to the wire 56 and are respectively placed at a right-side position and a left-side position of the operational-amplifier cell 50. So, if some variation occurs in the right-side circuit so that an amount of electric current supplied from a buffer is changed, variation of voltage for the common impedance should be transmitted to the left-side circuit. In short, an interference occurs between the circuits.

Figure 6A:
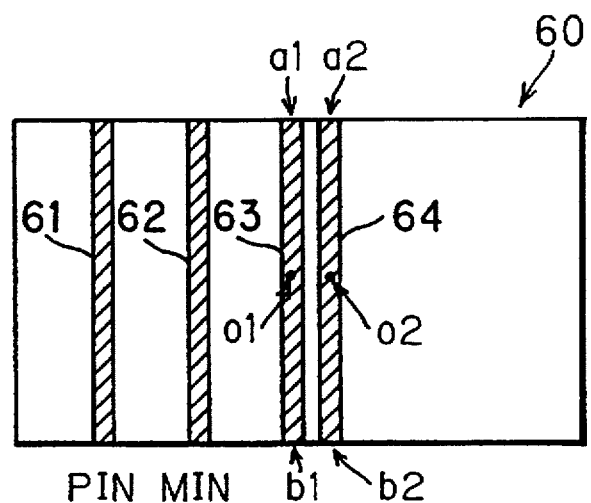
FIG. 6A shows a layout of an operational-amplifier cell which is improved as compared to the operational-amplifier cell of FIG. 5A.
Figure 6B:
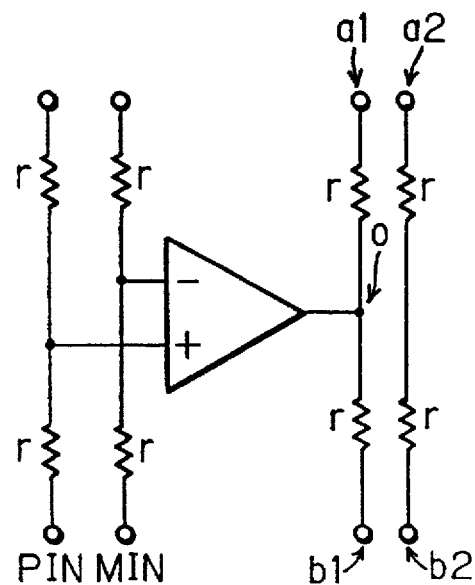
FIG. 6B shows an equivalent circuit of the operational-amplifier cell of FIG. 6A.

FIGS. 6A and 6B show an operational-amplifier cell 60 which is improved to solve the aforementioned problem. Herein, FIG. 6A shows an example of a layout of the operational-amplifier cell 60; and FIG. 6B shows an equivalent circuit of the operational-amplifier cell 60. The operational-amplifier cell 60 provides two input wires 61 and 62, which are connected to two inputs 'PIN' and 'MIN' respectively, and one output wire 63. In addition to those wires 61 to 63, the operational-amplifier cell 60 provides a dummy wire 64 which is arranged in parallel with the output wire 63.

Figure 7A:
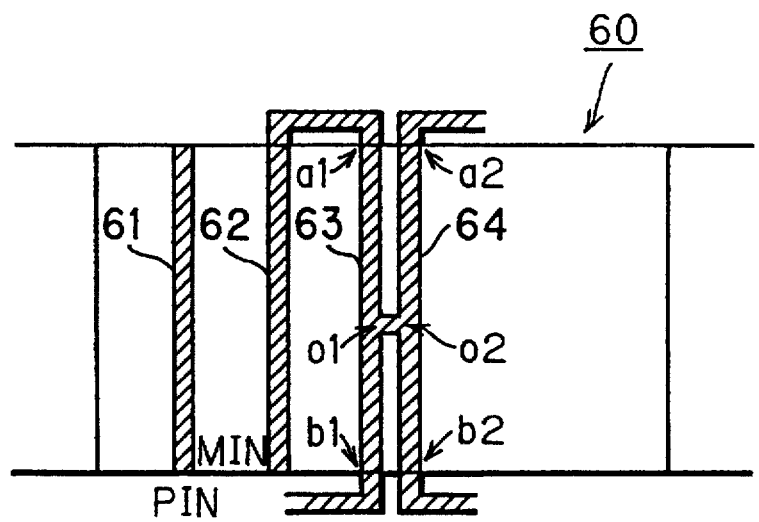
FIGS. 7A and 7B show a modified example of the operational-amplifier cell.
Figure 7B:
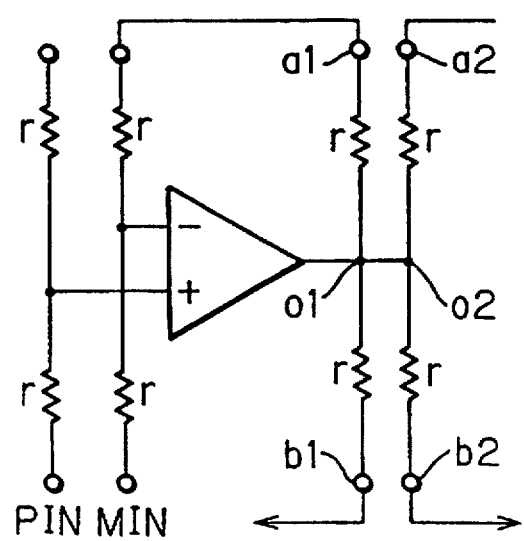

FIGS. 7A and 7B show a modified example of the operational-amplifier cell 60 which acts as a buffer. Herein, a midpoint '1' of the output wire 63 is connected to a midpoint 'o2' of the dummy wire 64. In addition, a low-end terminal 'b1' of the output wire 63 is connected to a left-side circuit (not shown) in a wiring area, wherein the left-side circuit is placed at a left-side position of the operational-amplifier cell 60. Further, a low-end terminal 'b2' of the dummy wire 64 is connected to a right-side circuit (not shown) in the wiring area, wherein the right-side circuit is placed at a right-side position of the operational-amplifier cell 60. Moreover, a high-end terminal 'a1' of the output wire 63 is connected to the input wire 62 and a high-end terminal 'a2' of the dummy wire 64 is connected to the right-side circuit.

As described above, the operational-amplifier cell 60 shown in FIGS. 7A and 7B is configured such that the dummy wire 64 is provided to cooperate with the output wire 63. Such a configuration prevents a variation of electric potential, which occurs at the low-end terminal b1 of the output wire 63, from being directly transmitted to the low-end terminal b2 of the dummy wire 64. Similarly, it prevents a variation of electric potential, which occurs at the low-end terminal b2, from being directly transmitted to the low-end terminal b1. Such a preventive effect works as if common impedance is substantially reduced. In short, an interference between circuits can be suppressed.

Figure 8A:
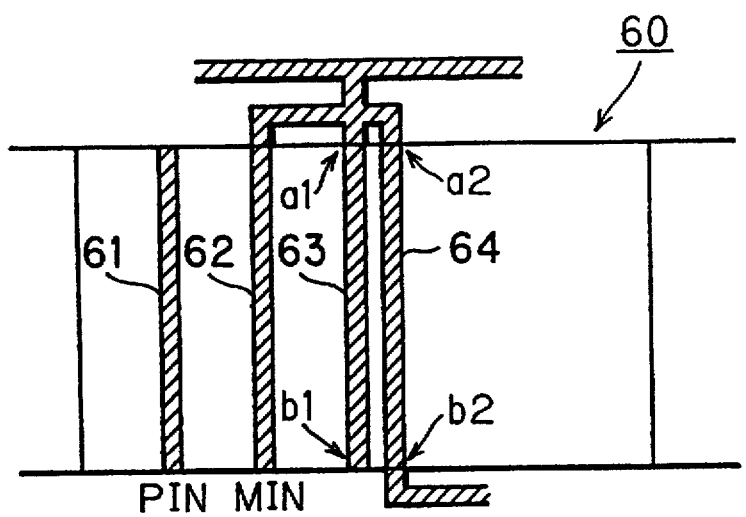
FIGS. 8A and 8B show another modified example of the operational-amplifier cell.
Figure 8B:
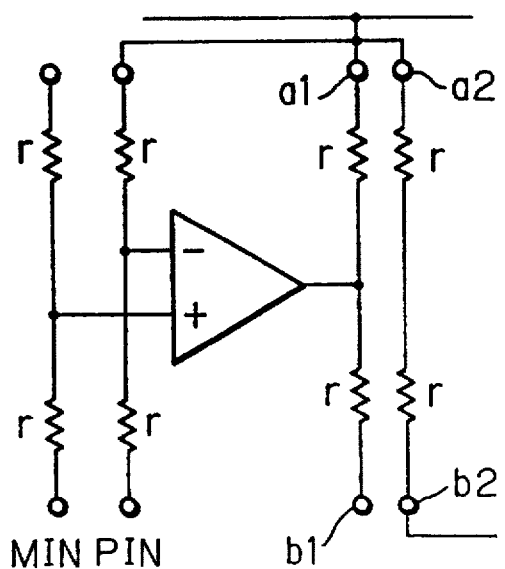

FIGS. 8A and 8B show another modified example of the operational-amplifier cell 60. This example employs so-called "through wiring". In other words, the dummy wire 64 and the output wire 63 are connected together at their high-end sections so as to provide connection between upper and lower wiring areas across the operational-amplifier cell 60.

Figure 9:
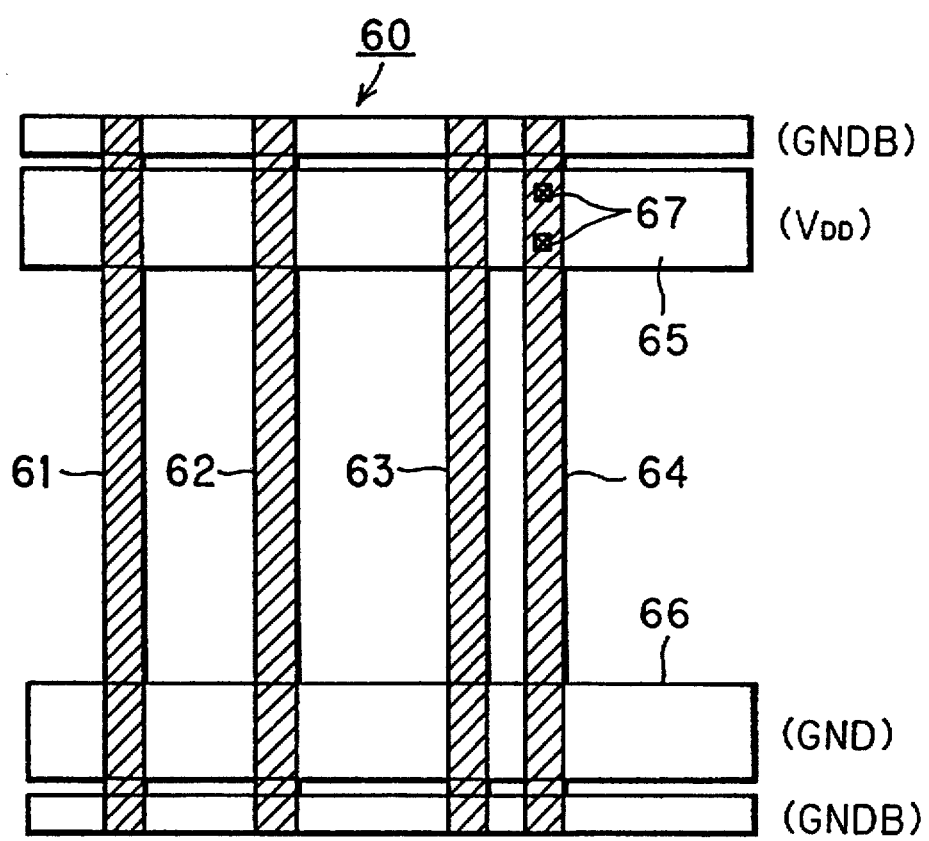
FIG. 9 shows a layout of the operational-amplifier cell in which a dummy wire is fixed.

Incidentally, if the dummy wire 64 is not used in the operational-amplifier cell 60, the configuration of the operational-amplifier cell 60 can be modified as shown by FIG. 9. Herein, the dummy wire 64 is short-circuited by via holes (or connection holes) 67 which are placed between the dummy wire 64 and a VDD-side power-source wire 65. If the dummy wire 64 is used in a floating state, there is a possibility that electrification will cause noise for circuit operations. The configuration of FIG. 9 functions to fix the electric potential of the dummy wire 64. Thus, it is possible to avoid occurrence of errors in the circuit operations. Similarly, the dummy wire 64 can contact with a GND-side power-source wire 66.

For convenience's sake, the present embodiment describes that standardization is made between analog-circuit blocks with respect to selected elements such as height of the cell, power-source wires, scale and position of input/output wires. However, it is possible to establish matching of some elements between the analog-circuit block and digital-circuit block. If so, it is possible to perform automatic layout wiring for analog/digital mixed LSI circuits with ease; and it is possible to improve the area efficiency.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A semiconductor integrated circuit comprising:

an analog circuit block that is configured by a plurality of analog cells, each of the analog cells being standardized with respect to height thereof;

at least two power source wires arranged such that the two power source wires are commonly used by the plurality of analog cells; and input/output wires provided for each analog cell and arranged in a direction perpendicular to the power source wires, wherein each analog cell is surrounded by a guard-ring diffusion layer and a plurality of guard-ring wires are provided to contact with the guard-ring diffusion layer.

2. The semiconductor integrated circuit as defined in claim 1, further comprising a dummy wire that is connected to an output wire of the input/output wires.

3. The semiconductor integrated circuit as defined in claim 2, wherein a midpoint of the dummy wire is connected to a midpoint of the output wire.

4. The semiconductor integrated circuit as defined in claim 1, wherein an input wire of the input/output wires is connected to an output wire of the input/output wires, and the output wire is connected to a dummy wire.

5. An analog cell having a function of an operational amplifier and used for an analog circuit block which is fabricated on a semiconductor integrated circuit chip, the analog cell comprising:

two input wires, each of the input wires for inputting an input signal to the operational amplifier;

an output wire for providing an output signal, at least one of the input wires being coupled to the output wire; and a dummy wire arranged in parallel with the output wire, wherein a midpoint of the output wire is connected to a midpoint of the dummy wire.

6. The analog cell as defined in claim 5, wherein at least one of the input wires is connected to the output wire.

7. The analog cell as defined in claim 5, wherein the analog cell is surrounded by a guard-ring diffusion layer and guard-ring wires are provided to contact with the guard-ring diffusion layer.

8. The analog cell as defined in claim 5, wherein the analog cell is standardized with respect to at least one of height, position of power source wires, and position of input and output wires.

9. The analog cell as defined in claim 5, wherein power source wires are arranged such that the power source wires can be commonly used with other analog cells, and the input wires and the output wire are arranged in a direction perpendicular to the power source wires.

10. A semiconductor integrated circuit comprising:

an analog circuit block that is configured by a plurality of analog cells, each of the analog cells being standardized with respect to height thereof;

at least two power source wires arranged such that the two power source wires are commonly used by the plurality of analog cells; and input/output wires provided for each analog cell and arranged in a direction perpendicular to the power source wires, wherein a dummy wire is additionally provided for at least one of the analog cells and is arranged in parallel with the input/output wires in order to reduce interference between the analog cells, and wherein the dummy wire is connected to an output wire of the input/output wires.

11. The semiconductor integrated circuit as defined in claim 10, wherein a midpoint of the dummy wire is connected to a midpoint of the output wire.

12. A semiconductor integrated circuit comprising:

an analog circuit block that is configured by a plurality of analog cells, each of the analog cells being standardized with respect to height thereof;

at least two power source wires arranged such that the two power source wires are commonly used by the plurality of analog cells; and input/output wires provided for each analog cell and arranged in a direction perpendicular to the power source wires, wherein a dummy wire is additionally provided for at least one of the analog cells and is arranged in parallel with the input/output wires in order to reduce interference between the analog cells, and wherein each analog cell is surrounded by a guard-ring diffusion layer and a plurality of guard-ring wires are provided to contact with the guard-ring diffusion layer.

13. An analog cell having a function of an operational amplifier and used for an analog circuit block which is fabricated on a semiconductor integrated circuit chip, the analog cell comprising:

two input wires, each of the input wires for inputting an input signal to the operational amplifier;

an output wire for providing an output signal; and a dummy wire arranged in parallel with the output wire in order to reduce the common output impedance of the operational amplifier so that interference between analog cells is reduced, wherein at least one of the input wires is coupled to the output wire and the dummy wire, and the output wire is connected to the dummy wire.

14. An analog cell having a function of an operational amplifier and used for an analog circuit block which is fabricated on a semiconductor integrated circuit chip the analog cell comprising:

two input wires, each of the input wires for inputting an input signal to the operational amplifier;

an output wire for providing an output signal; and a dummy wire arranged in parallel with the output wire in order to reduce the common output impedance of the operational amplifier so that interference between analog cells is reduced, wherein at least one of the input wires is coupled to the output wire and the dummy wire, and wherein the analog cell is surrounded by a guard-ring diffusion layer and guard-ring wires are provided to contact with the guard-ring diffusion layer.

15. An analog cell having a function of an operational amplifier and used for an analog circuit block which is fabricated on a semiconductor integrated circuit chip, the analog cell comprising:

two input wires, each of the input wires for inputting an input signal to the operational amplifier;

an output wire for providing an output signal; and a dummy wire arranged in parallel with the output wire in order to reduce the common output impedance of the operational amplifier so that interference between analog cells is reduced, wherein at least one of the input wires is coupled to the output wire and the dummy wire, wherein power source wires are arranged such that the power source wires can be commonly used with other analog cells, and the input wires and the output wire are arranged in a direction perpendicular to the power source wires.

\* \* \* \* \*